(12) United States Patent
Yamada

(10) Patent No.: US 11,094,367 B2
(45) Date of Patent: Aug. 17, 2021

(54) SEMICONDUCTOR DEVICE WITH SUB-AMPLIFIER

(71) Applicant: UltraMemory Inc., Tokyo (JP)

(72) Inventor: Yasutoshi Yamada, Tokyo (JP)

(73) Assignee: ULTRAMEMORY INC., Tokyo (JP)

( * ) Notice: Subject to any disclaimer, the term of this patent is extended or adjusted under 35 U.S.C. 154(b) by 0 days.

(21) Appl. No.: 16/645,640

(22) PCT Filed: Sep. 11, 2017

(86) PCT No.: PCT/JP2017/032724
§ 371 (c)(1),
(2) Date: Mar. 9, 2020

(87) PCT Pub. No.: WO2019/049385
PCT Pub. Date: Mar. 14, 2019

(65) Prior Publication Data
US 2020/0286546 A1    Sep. 10, 2020

(51) Int. Cl.
*G11C 7/00* (2006.01)
*G11C 11/4091* (2006.01)
*G11C 7/06* (2006.01)

(52) U.S. Cl.
CPC ............ *G11C 11/4091* (2013.01); *G11C 7/06* (2013.01)

(58) Field of Classification Search
CPC .................................. G11C 11/4091
USPC ........................................................ 365/203
See application file for complete search history.

(56) References Cited

U.S. PATENT DOCUMENTS

| 5,369,620 | A | 11/1994 | Sugibayashi | |
|---|---|---|---|---|
| 5,546,346 | A * | 8/1996 | Agata | G11C 7/1072 365/203 |
| 6,333,889 | B1 | 12/2001 | Arimoto | |
| 2004/0085820 | A1 | 5/2004 | Taito | |
| 2010/0226192 | A1* | 9/2010 | Moon | G11C 11/4096 365/203 |
| 2010/0238744 | A1* | 9/2010 | Yano | G11C 11/4091 365/189.11 |

(Continued)

FOREIGN PATENT DOCUMENTS

| JP | H0636556 A | 2/1994 |
|---|---|---|
| JP | 2000207886 A | 7/2000 |

(Continued)

*Primary Examiner* — Min Huang
(74) *Attorney, Agent, or Firm* — Muncy, Geissler, Olds & Lowe, P.C.

(57) ABSTRACT

Provided are a sub-amplifier, a switching device and a semiconductor device capable of simultaneously reading or writing many data items, while suppressing an increase in chip surface area, by using a single end signal line. A sub-amplifier SAP comprises: a first pre-charge circuit 110 that releases pre-charges of a pair of local wires LIOT/LIOB; a local inversion drive circuit 120 that, on the basis of a write signal WT, inverts and transfers write data to a sense amplifier SA from a main wire MIOB via one of the local wires LIOT/LIOB; a local non-inversion drive circuit 130 that, on the basis of the write signal WT, transfers the write data to the sense amplifier SA from the main wire MIOB via the other one of the local wires LIOT/LIOB; and a main inversion drive circuit 140 that, on the basis of a read signal RT, inverts and transfers read data to the main wire MIOB from one of the local wires LIOT/LIOB.

7 Claims, 12 Drawing Sheets

(56) References Cited

U.S. PATENT DOCUMENTS

| 2011/0175660 A1* | 7/2011 | Matano ............... G11C 11/4097 |
| | | 327/306 |
| 2011/0176379 A1* | 7/2011 | Takayama ........... G11C 11/4097 |
| | | 365/208 |
| 2016/0267963 A1 | 9/2016 | Koike |

FOREIGN PATENT DOCUMENTS

| JP | 2001067863 A | 3/2001 |
| JP | 2004158050 A | 6/2004 |
| WO | WO2015079608 A1 | 6/2015 |

\* cited by examiner

SEMICONDUCTOR DEVICE WITH SUB-AMPLIFIER

TECHNICAL FIELD

The present invention relates to a sub-amplifier, a switching device, and a semiconductor device.

BACKGROUND ART

In the related art, a semiconductor device having a plurality of functional blocks has been known. For example, a dynamic random access memory (DRAM) capable of reading a large amount of data from one block without increasing a chip surface area has been proposed (for example, see Patent Document 1). In addition, a logic embedded DRAM with an improved internal data transfer rate has been proposed (for example, see Patent Document 2).
Patent Document 1: Japanese Unexamined Patent Application, Publication No. H06-36556
Patent Document 2: Japanese Unexamined Patent Application, Publication No. 2001-67863

DISCLOSURE OF THE INVENTION

Problems to be Solved by the Invention

In the DRAM disclosed in Patent Document 1, it is possible to extract data corresponding to the number of sense amplifiers from a row of sense amplifiers. In addition, data lines for writing and reading can be shared. In contrast, since a circuit is configured assuming that a select data line is a complementary signal, it is difficult to perform writing in a case where a single-ended signal is transferred through the select data line. Therefore, it is difficult to use the select data line as a single end signal line, to reduce the number of select data lines, and thus to reduce the pitch between the select data lines.

In contrast, in the logic-embedded DRAM disclosed in Patent Document 2, one internal data line is provided in correspondence with two sense amplifier circuits. The internal data line is a single end signal line and transfers a 1-bit data signal. As such, the use of the single end signal line makes it possible to transfer many data signals. Therefore, it is possible to reduce the pitch between the data lines, as compared to a case where a complementary signal is used. In addition, it is preferable to form a semiconductor device with another configuration while using the single end signal line.

An object of the invention is to provide a sub-amplifier, a switching device, and a semiconductor device that use a single end signal line, which makes it possible to read or write a large amount of data at the same time while suppressing an increase in chip surface area.

Means for Solving the Problems

The invention relates to a sub-amplifier that is connected to a sense amplifier through a column switch and is connected to a main wire through which write data and read data are transferred. The sub-amplifier includes: a pair of local wires that are connected to the sense amplifier and the column switch; a first pre-charge circuit that is connected to each of the pair of local wires and releases pre-charging of the pair of local wires when the write data is written and the read data is read; a local inversion drive circuit that is connected to one of the pair of local wires and the main wire and inverts and transfers the write data from the main wire to the sense amplifier through the one local wire on the basis of a write signal; a local non-inversion drive circuit that is connected to the other of the pair of local wires and the main wire and transfers the write data from the main wire to the sense amplifier through the other local wire on the basis of the write signal; and a main inversion drive circuit that is connected to one of the pair of local wires and the main wire and inverts and transfers the read data from the one local wire to the main wire on the basis of a read signal.

Preferably, the first pre-charge circuit maintains a potential of the one local wire at a pre-charge potential in a case where high data is read from the sense amplifier and the potential of the one local wire is less than a predetermined value.

Preferably, the first pre-charge circuit maintains a potential of the other local wire at the pre-charge potential in a case where low data is inverted and written to the sense amplifier that holds high data and the potential of the other local wire is less than a predetermined value.

In addition, the invention relates to a switching device including the sub-amplifier and a plurality of pairs of sense amplifiers and column switches. The column switches are connected to the sub-amplifier and a pair of the sense amplifier and the column switch are arranged so as to face each other with the sub-amplifier interposed therebetween.

Further, the invention relates to a switching device including the sub-amplifier and a main amplifier that is connected to the sub-amplifier through a main wire. The main amplifier includes a second pre-charge circuit that pre-charges the main wire.

Preferably, the second pre-charge circuit pre-charges the main wire with an external potential higher than a potential used for the pre-charging by the first pre-charge circuit.

Preferably, the second pre-charge circuit pre-charges the main wire with a potential lower than an external potential.

Preferably, the first pre-charge circuit pre-charges the pair of local wires with the same potential as a potential at which the second pre-charge circuit pre-charges the main wire.

Furthermore, the invention relates to a semiconductor device including: a plurality of the switching devices that are arranged adjacent to each other; a plurality of main wires that are arranged in a direction intersecting an arrangement direction of the switching devices; and a plurality of column wires that are arranged in the arrangement direction of the switching devices.

Effects of the Invention

According to the invention, it is possible to provide a sub-amplifier, a switching device, and a semiconductor device that use a single end signal line, which makes it possible to read or write a large amount of data at the same time while suppressing an increase in chip surface area.

PREFERRED MODE FOR CARRYING OUT THE INVENTION

Figure 1:
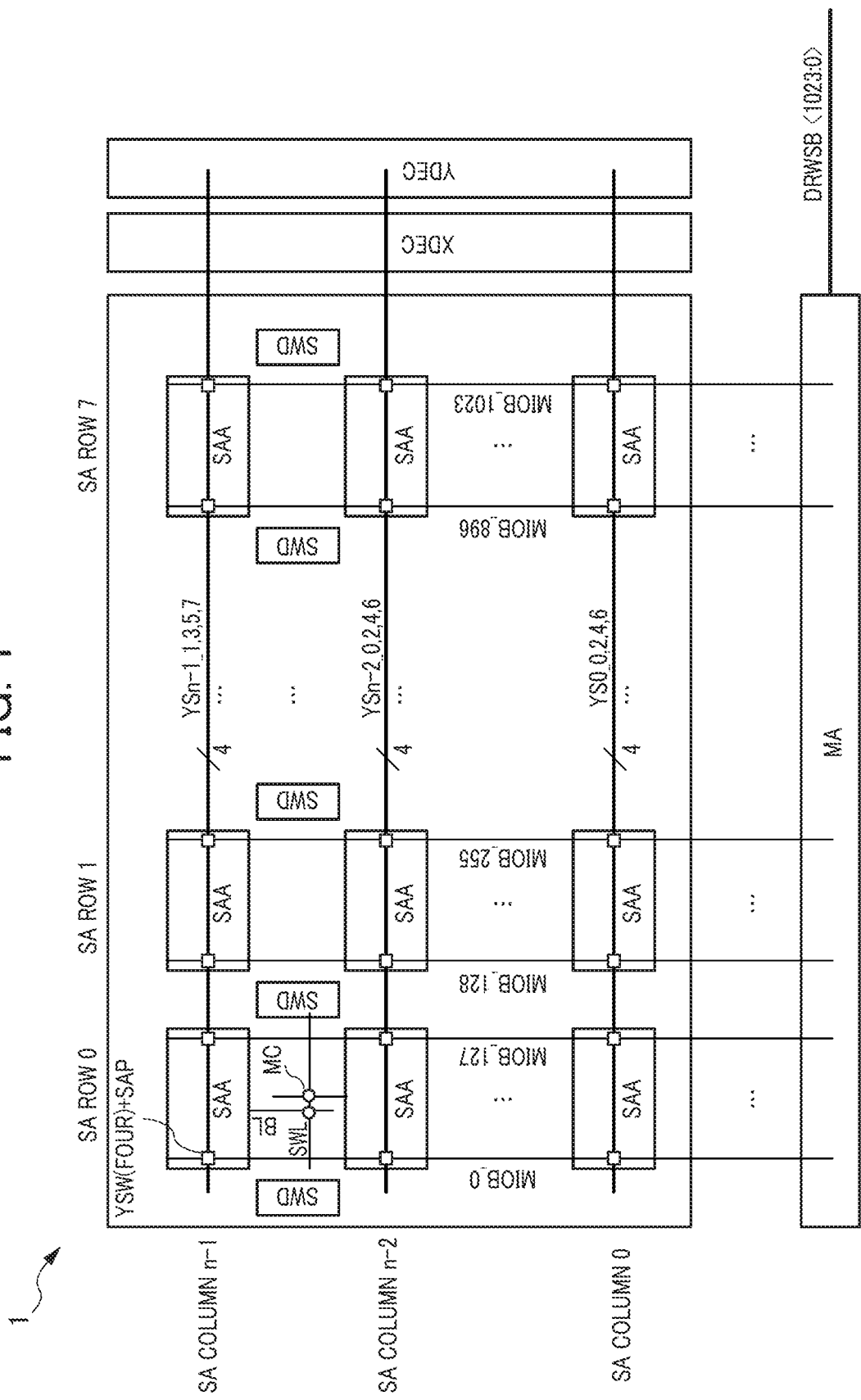
FIG. 1 is a diagram schematically illustrating the configuration of a semiconductor device according to a first embodiment of the invention.

Hereinafter, each embodiment of a sub-amplifier SAP, a switching device 10, and a semiconductor device 1 according to each embodiment of the invention will be described with reference to the drawings. In each embodiment, a wire, a signal flowing through the wire, and the potential of the wire are denoted by the same reference numeral and are described. First, the outline of the sub-amplifier SAP, the switching device 10, and the semiconductor device 1 according to each embodiment of the invention will be described.

The semiconductor device 1 is, for example, a dynamic random access memory (DRAM) and includes a plurality of functional blocks. The semiconductor device 1 is configured such that a plurality of data items can be read and written from and to each of the plurality of functional blocks.

First Embodiment

Next, a sub-amplifier SAP, a switching device 10, and a semiconductor device 1 according to a first embodiment of the invention will be described with reference to FIGS. 1 to 6. As illustrated in FIG. 1, the semiconductor device 1 includes a sense amplifier (SA) region SAA, a main amplifier MA, an X decoder XDEC, a Y decoder YDEC, a sub-word driver SWD, a memory cell MC, a main wire MIOB, and a column wire YS.

For example, a plurality of sense amplifier regions SAA are arranged in a matrix. In this embodiment, eight sense amplifier regions SAA are arranged in a row direction (X direction) and n (n is a natural number) sense amplifier regions SAA are arranged in a column direction (Y direction). A plurality of bit lines BL are arranged (laid out) along the column direction between the column directions of the sense amplifier regions SAA. Each sense amplifier region SAA includes a plurality of switching devices 10.

A plurality of switching devices 10 are arranged adjacent to each other to form the sense amplifier region SAA. In this embodiment, a plurality of switching devices 10 are arranged adjacent to each other in the row direction to form the sense amplifier region SAA. The configuration of the switching device 10 will be described below.

The main amplifier MA is provided in one end portion in the arrangement direction of the sense amplifier regions SAA. In this embodiment, the main amplifier MA is provided at one end in the column direction (one end in the Y direction). Read data and write data are transferred between the main amplifier MA and the sense amplifier region SAA. A data read/write bus DRWSB through which write data or read data is transferred to and from the outside is connected to the main amplifier MA. The circuit configuration of the main amplifier MA will be described below.

The X decoder XDEC and the Y decoder YDEC are provided in another end portion in the arrangement direction of the sense amplifier regions SAA. In this embodiment, the X decoder XDEC and the Y decoder YDEC are provided at one end in the row direction (one end in the X direction). The Y decoder YDEC transfers a column signal YS for selecting an effective switching device 10 to the switching devices 10 forming the sense amplifier region SAA.

A plurality of sub-word drivers SWD are arranged in a matrix. In this embodiment, the sub-word drivers SWD are arranged between adjacent sense amplifier regions SAA in the column direction and are arranged in the row direction at both ends of a region surrounded by the sense amplifiers adjacent to each other in the column direction. The X decoder XDEC and a plurality of sub-word drivers SWD arranged in the row direction are connected by a plurality of main word lines (not illustrated). A plurality of sub-word lines SWL which are arranged in the row direction are provided in a plurality of sub-word drivers SWD. The sub-word driver SWD forms a circuit, using a signal for selecting a main word and a sub-word line (not illustrated) generated from any input address signal by the X decoder XDEC as an input signal, and selects one sub-word line SWL.

A plurality of memory cells MC are arranged in each of the regions surrounded by the sense amplifier regions SAA arranged in the column direction and the sub-word drivers SWD arranged in the row direction. Each of the plurality of memory cells MC is provided at an intersection point of the bit line BL and the sub-word line SWL.

A plurality of main wires MIOB are arranged in a direction that intersects the arrangement direction of the switching devices 10. In this embodiment, a plurality of main wires MIOB that extend in the column direction are arranged in the row direction. That is, each of the main wires MIOB is provided across n sense amplifier regions SAA which are arranged in the column direction. In this embodiment, 128 main wires MIOB are provided for one sense amplifier region SAA and a total of 1024 main wires MIOB are provided. Each of the plurality of main wires MIOB has one end connected to the main amplifier MA which is provided at one end in the column direction. Read data and write data are transferred between the plurality of main wires MIOB and a plurality of sense amplifier regions SAA. Each of the plurality of main wires MIOB is a signal line capable of performing single-ended transfer. Therefore, 128 main wires MIOB are provided for 128 switching devices 10 included in one sense amplifier region SAA.

A plurality of column wires YS are arranged along the arrangement direction of the switching devices 10 forming the sense amplifier region SAA. In this embodiment, a plurality of column wires YS that extend in the row direction are arranged along the column direction. That is, each column wire YS is provided across eight sense amplifier regions SAA which are arranged in the row direction. In this embodiment, the column wire YS has one end which is connected to the Y decoder YDEC provided at one end in the row direction and turns on and off column switches YSW (which will be described below) of a plurality of switching devices 10.

Figure 2:
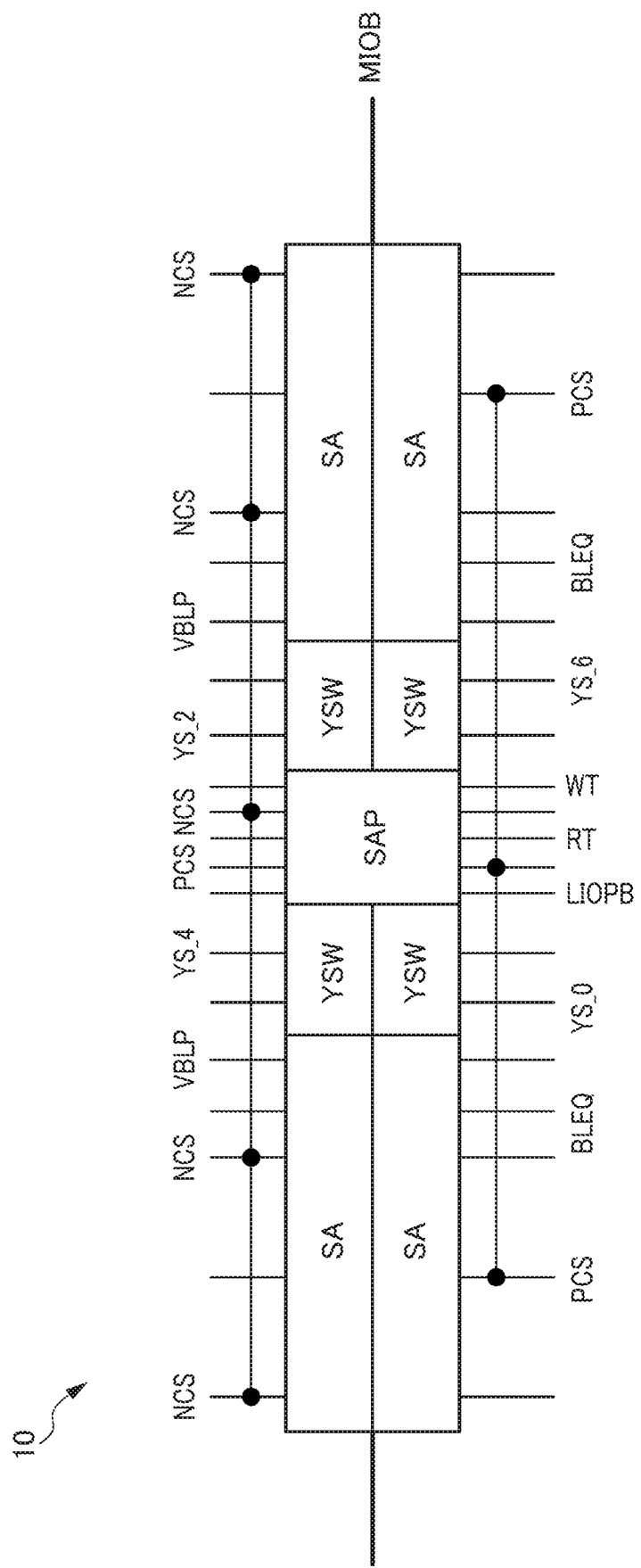
FIG. 2 is a diagram schematically illustrating the configuration of a switching device according to the first embodiment.

Next, the switching device 10 will be described. A plurality of switching devices 10 are arranged adjacent to each other to form one sense amplifier region SAA. In this embodiment, 128 switching devices 10 are arranged side by side in the row direction to form one sense amplifier region SAA. The switching device 10 includes the sub-amplifier SAP, the column switch YSW, and a sense amplifier SA. In this embodiment, as illustrated in FIG. 2, the switching device 10 includes one sub-amplifier SAP, four column switches YSW, and four sense amplifiers SA.

The sub-amplifier SAP is connected to the main wire MIOB through which write data and read data are transferred and is also connected to power lines NCS and PCS. In addition, the sub-amplifier SAP is connected to a first pre-charge wire LIOPB for transferring a first pre-charge signal, a write wire WT for transferring a write signal, and a read wire RT for transferring a read signal. The circuit configuration of the sub-amplifier SAP will be described below.

The column switch YSW is provided adjacent to the sub-amplifier SAP and is connected to the sub-amplifier SAP. In this embodiment, a pair of the column switches YSW are provided around the main wire MIOB and face each other with the sub-amplifier SAP interposed therebetween. Specifically, two column switches YSW are provided at each of two ends of the sub-amplifier SAP along the column direction of the sense amplifier region SAA. In addition, two column switches YSW are provided on both sides of the main wire MIOB in the row direction of the sense amplifier region SAA. Each of the column switches YSW is connected to one column wire YS. The column switch YSW turns on and off the operation of the switching device 10 on the basis of the column signal YS transferred through the column wire YS. The circuit configuration of the column switch YSW will be described below.

The sense amplifier SA and the column switch YSW are provided so as to form a pair. The sense amplifier SA is provided adjacent to the column switch YSW. In this embodiment, a pair of the sense amplifiers SA are provided around the main wire MIOB and face each other with the sub-amplifier SAP interposed therebetween. Specifically, each sense amplifier SA is provided at one end of the column switch YSW along the column direction of the sense amplifier region SAA. In addition, the sense amplifiers SA are provided on both sides of the main wire MIOB in the row direction of the sense amplifier region SAA. The sense amplifiers SA are connected to the power lines NCS and PCS and are also connected to, for example, an equalizer wire BLEQ, a bit line pre-charge power supply VBLP, and a bit line pair (not illustrated). The circuit configuration of the sense amplifier SA will be described below.

Figure 3:
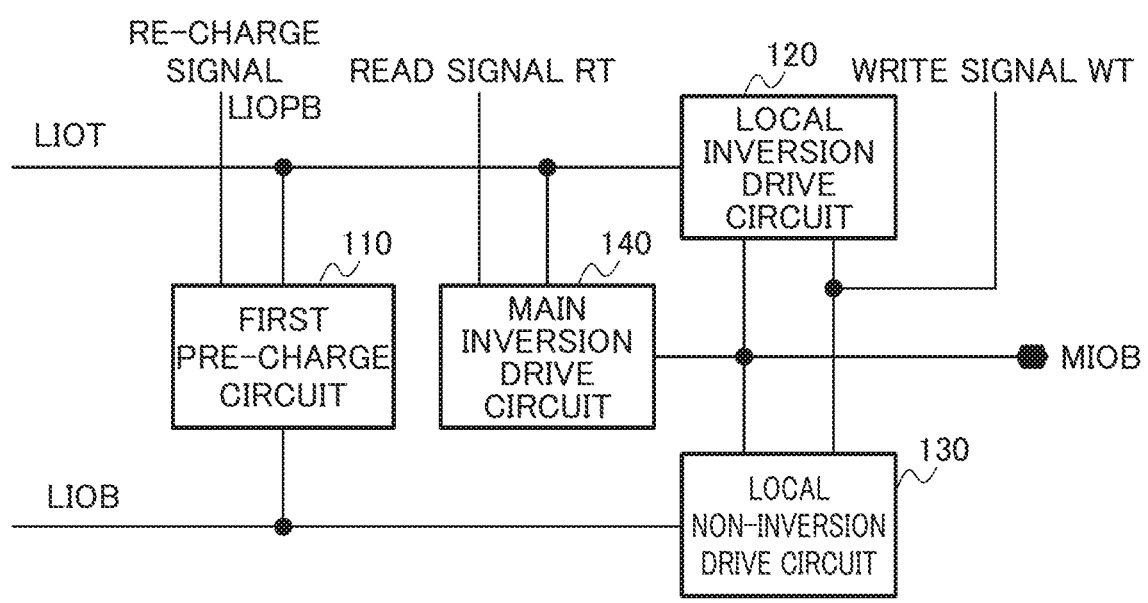
FIG. 3 is a diagram schematically illustrating the circuit configuration of a sub-amplifier according to the first embodiment.

Next, the circuit configuration of the sub-amplifier SAP, the main amplifier MA, the column switch YSW, and the sense amplifier SA will be described. As illustrated in FIG. 3, the sub-amplifier SAP includes a pair of local wires LIOT and LIOB, a first pre-charge circuit 110, a local inversion drive circuit 120, a local non-inversion drive circuit 130, and a main inversion drive circuit 140.

The pair of local wires LIOT and LIOB are connected to the sense amplifier SA through the column switch YSW. Specifically, each of the pair of local wires LIOT and LIOB is connected to the column switch YSW and the sense amplifier SA in this order. The pair of local wires LIOT and LIOB transfer high or low data to the sense amplifier SA through the column switch YSW using a potential difference therebetween.

Figure 4:
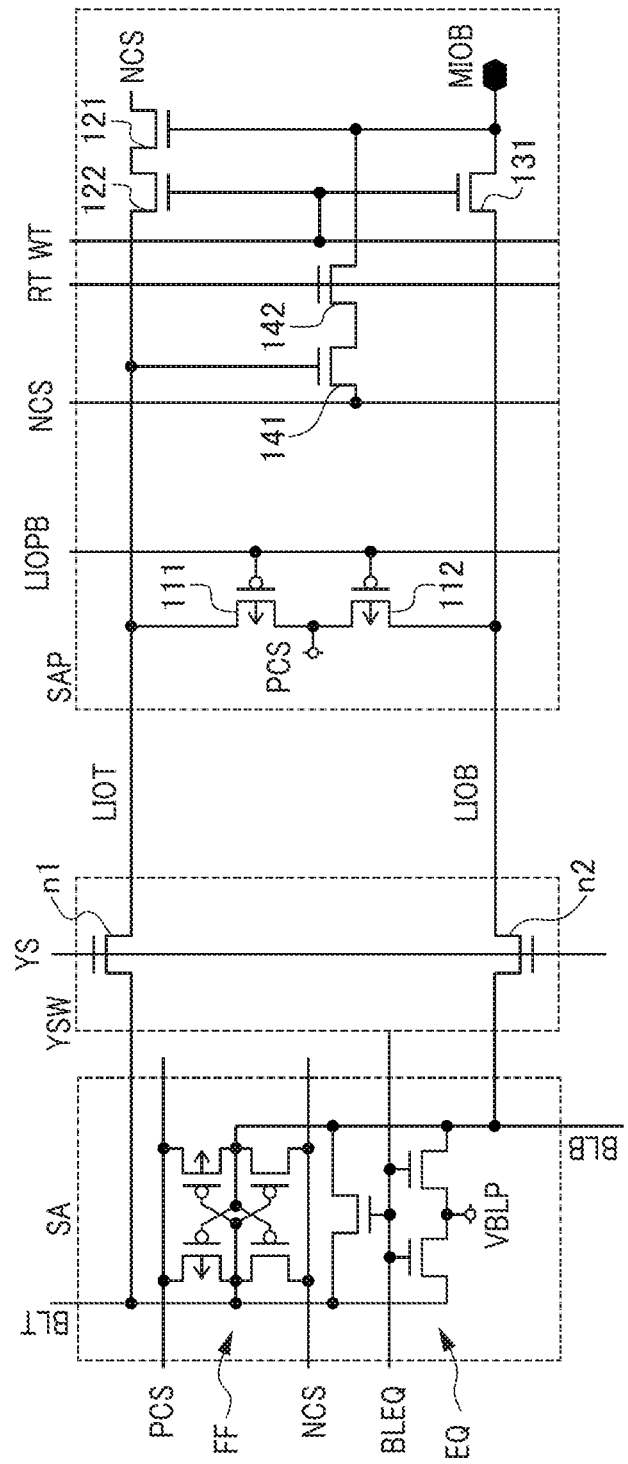
FIG. 4 is a circuit diagram illustrating the sub-amplifier according to the first embodiment.

The first pre-charge circuit 110 is connected to each of the pair of local wires LIOT and LIOB. The first pre-charge circuit 110 pre-charges each of the pair of local wires LIOT and LIOB. When write data is written and read data is read, the first pre-charge circuit 110 releases the pre-charging of the pair of local wires LIOT and LIOB. In this embodiment, as illustrated in FIG. 4, the first pre-charge circuit 110 includes two pMOS transistors 111 and 112 having gates connected to the first pre-charge wire LIOPB. In the first pre-charge circuit 110, a drain of one pMOS transistor 111 is connected to a drain of the other pMOS transistor 112 and the two drains are connected to the power line PCS. In addition, in the first pre-charge circuit 110, a source of the one pMOS transistor 111 is connected to one local wire LIOT and a source of the other pMOS transistor 112 is connected to the other local wire LIOB.

The local inversion drive circuit 120 is connected to one of the pair of local wires LIOT and LIOB and the main wire MIOB. In addition, the local inversion drive circuit 120 is connected to a write wire WT. The local inversion drive circuit 120 inverts and transfers write data from the main wire MIOB to the sense amplifier SA through one local wire LIOT on the basis of the write signal WT. As illustrated in FIG. 4, the local inversion drive circuit 120 includes two nMOS transistors 121 and 122. In the local inversion drive circuit 120, a drain of one nMOS transistor 121 is connected to the power line NCS and a source of the one nMOS transistor 121 is connected to a drain of the other nMOS transistor 122. In addition, in the local inversion drive circuit 120, a source of the other nMOS transistor 122 is connected to the one local wire LIOT. In the local inversion drive circuit 120, a gate of the one nMOS transistor 121 is connected to the main wire MIOB. In the local inversion drive circuit 120, a gate of the other nMOS transistor 122 is connected to the write wire WT.

The local non-inversion drive circuit 130 is connected to the other of the pair of local wires LIOT and LIOB and the main wire MIOB. In addition, the local non-inversion drive circuit 130 is connected to the write wire WT. The local non-inversion drive circuit 130 transfers write data from the main wire MIOB to the sense amplifier SA through the other local wire LIOB on the basis of the write signal WT. As illustrated in FIG. 4, the local non-inversion drive circuit 130 includes one nMOS transistor 131. In the local non-inversion drive circuit 130, a drain of the nMOS transistor 131 is connected to the main wire MIOB. In addition, in the local non-inversion drive circuit 130, a source of the nMOS transistor 131 is connected to the other local wire LIOB. Further, in the local non-inversion drive circuit 130, a gate of the nMOS transistor 131 is connected to the write wire WT.

The main inversion drive circuit 140 is connected to one (local wire LIOT) of the pair of local wires LIOT and LIOB and the main wire MIOB. In addition, the main inversion drive circuit 140 is connected to the read wire RT. The main inversion drive circuit 140 inverts and transfers read data from the one local wire LIOT to the main wire MIOB on the basis of the read signal RT. As illustrated in FIG. 4, the main inversion drive circuit 140 includes two nMOS transistors 141 and 142. In the main inversion drive circuit 140, one nMOS transistor 141 has a drain connected to the power line NCS and a source connected to a drain of the other nMOS transistor 142. In addition, a source of the other nMOS transistor 142 in the main inversion drive circuit 140 is connected to the gate of the one nMOS transistor 121 in the local inversion drive circuit 120 and the main wire MIOB. Further, in the main inversion drive circuit 140, a gate of the one nMOS transistor 141 is connected to one local wire LIOT and a gate of the other nMOS transistor 142 is connected to the read wire RT.

The main amplifier MA is connected between the data read/write bus DRWSB and the main wire MIOB. The main amplifier MA includes a write driver 21, a read driver 22, and a second pre-charge circuit 23 that pre-charges the main wire MIOB.

The write driver 21 is a circuit that outputs write data from the data read/write bus DRWSB to the main wire MIOB. Specifically, the write driver 21 latches write data for a period for which a clock signal DWCLKB is at a low level, is activated when a write enable signal DWAEB is at a low level, and outputs the write data from the data read/write bus DRWSB to the main wire MIOB.

The read driver 22 is a circuit that outputs read data from the main wire MIOB to the data read/write bus DRWSB. Specifically, the read driver 22 latches the read data when a read enable signal DRAET is at a high level, is activated when a control signal DRAOB is at a low level, and outputs the read data from the main wire MIOB to the data read/write bus DRWSB.

Figure 5:
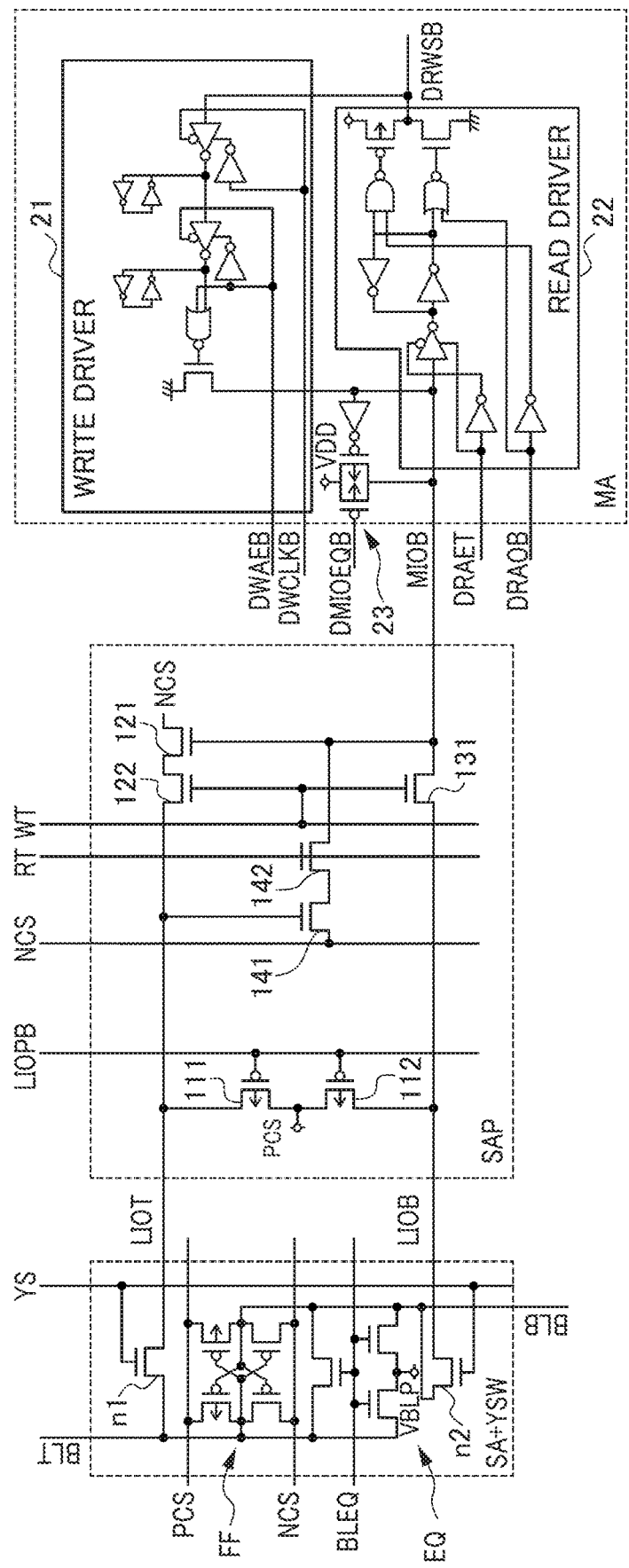
FIG. 5 is a circuit diagram illustrating the switching device according to the first embodiment.

As illustrated in FIG. 5, the second pre-charge circuit 23 includes a pMOS transistor that is connected to a main pre-charge wire DMIOEQB and pre-charges the main wire MIOB with an external potential VDD. In the second pre-charge circuit 23, the external potential VDD is applied to a drain of the pMOS transistor and a source of the pMOS transistor is connected to the main wire MIOB. In addition, in the second pre-charge circuit 23, a gate of the pMOS transistor is connected to the main pre-charge wire DMIOEQB. The second pre-charge circuit 23 pre-charges the main wire MIOB with the external potential VDD in a case where data is not read and written.

The column switch YSW turns on and off the connection between the sense amplifier SA and the pair of local wires LIOT and LIOB on the basis of the column signal transferred through the column wire YS. As illustrated in FIGS. 4 and 5, the column switch YSW includes two nMOS transistors n1 and n2. In the column switch YSW, one nMOS transistor n1 has a source connected to one local wire LIOT, a drain connected to one bit line BLT, and a gate connected to the column wire YS. In addition, in the column switch YSW, the other nMOS transistor n2 has a source connected to the other local wire LIOB, a drain connected to the other bit line BLB, and a gate connected to the column wire YS. Further, in FIG. 5, the column switch YSW and the sense amplifier SA are integrally illustrated.

The sense amplifier SA is connected to the equalizer wire BLEQ and a pair of bit lines BLT and BLB. As illustrated in FIGS. 4 and 5, the sense amplifier SA includes a flip-flop circuit FF and an equalizer circuit EQ. For example, the sense amplifier SA can be configured by appropriately combining the sense amplifier circuit and the equalizer circuit described in the related art of Japanese Unexamined Patent Application, Publication No. 2015-176617 and the embodiments and known methods. The sense amplifier SA outputs a high signal or a low signal to the bit line BL by changing the potential of a pair of bit lines using the flip-flop circuit FF connected to the power lines PCS and NCS. In addition, the sense amplifier SA equalizes the bit line to a potential VBLP using the equalizer circuit EQ for a standby period.

Figure 6:
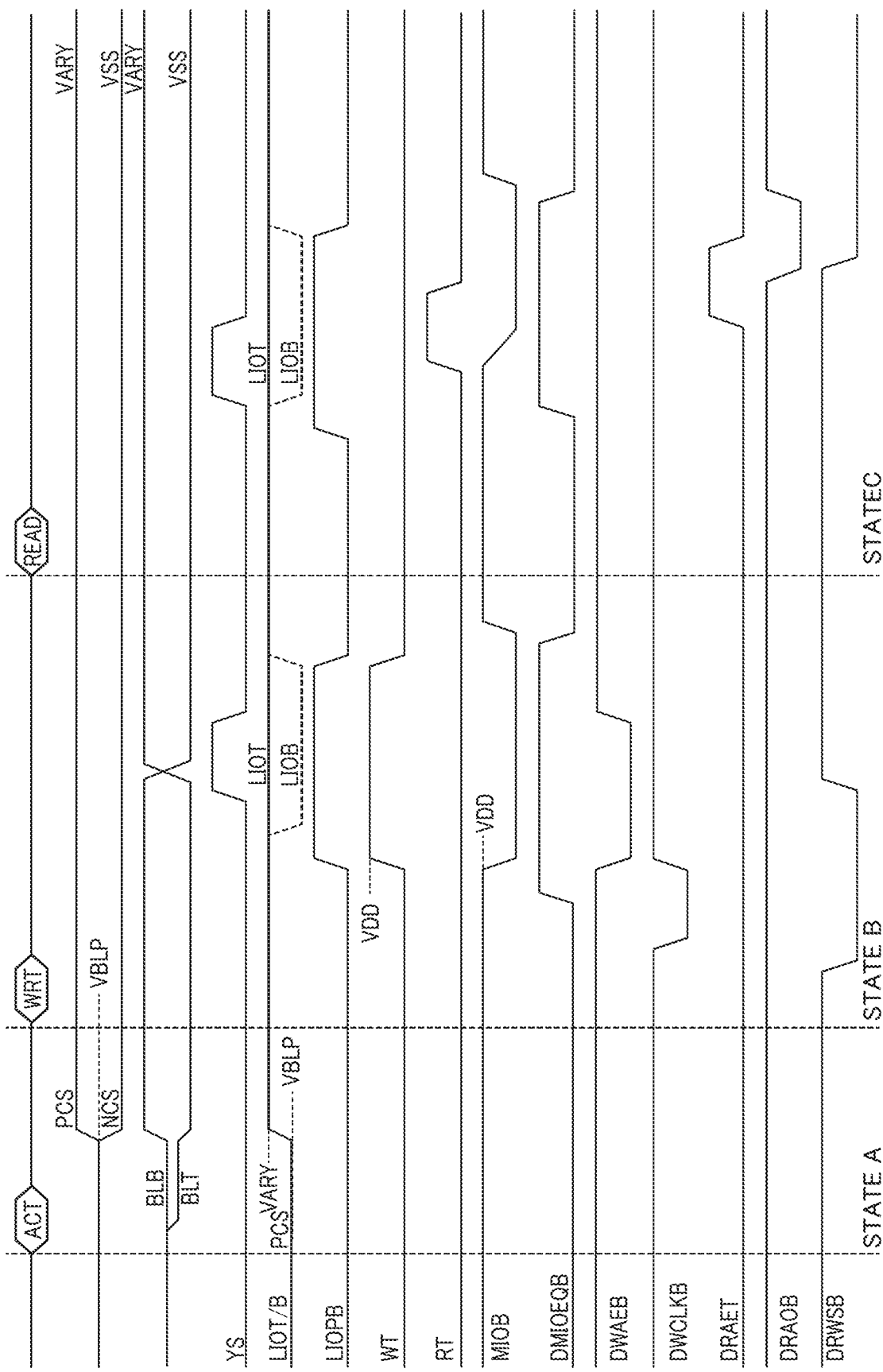
FIG. 6 is a waveform diagram illustrating an operation waveform of the switching device illustrated in FIG. 5.

Next, the operation of the switching device 10 will be described with reference to FIG. 6. In a standby state (before a state A), the power lines PCS and NCS are pre-charged to VBLP which is a half level of potential VARY. For example, when VARY is 1.0 V, VBLP is 0.5 V and the first pre-charge circuit 110 pre-charges the pair of local wires LIOT and LIOB with VBLP. The pre-charge signal DMIOEQB of the main pre-charge wire DMIOEQB is VSS (ground level) and the main wire MIOB is pre-charged to the level of the external potential VDD (VDD>VARY).

When an activation command ACT is input to the semiconductor device 1 in the state A, the sense amplifier SA corresponding to the selected row address is activated. At that time, the first pre-charge circuit 110 drives the pair of local wires LIOT and LIOB to the potential VARY.

In the state A, when a write command WRT is input to the semiconductor device 1, the semiconductor device is changed to a state B. In the state B, write data is input from the data read/write bus DRWSB to the main amplifier MA. Then, the second pre-charge circuit 23 releases the pre-charging of the main wire MIOB. In addition, the main amplifier MA transfers data to the main wire MIOB with the write enable signal DWAEB. The main amplifier MA transmits a pre-charge control signal LIOPB for controlling the first pre-charge circuit 110 at the same time as the write enable signal DWAEB. Further, the main amplifier MA transmits write signal to the local inversion drive circuit 120 and the local non-inversion drive circuit 130 through the write wire WT. The first pre-charge circuit 110 releases the pre-charging on the basis of the pre-charge control signal LIOPB. The local inversion drive circuit 120 and the local non-inversion drive circuit 130 transmit the data transferred to the main wire MIOB to the pair of local wires LIOT and LIOB. The column switch YSW is driven by the column signal YS and transfers data to the bit line BL. The sense amplifier SA writes the transferred data to the memory cell MC.

In the state B, when a read command READ is input to the semiconductor device 1, the semiconductor device 1 is changed to a state C. In the state C, the column switch YSW is driven by the column signal YS. In a case where the column switch YSW is driven, the sense amplifier SA writes data to one local wire LIOT. The main inversion drive circuit 140 transfers data to the main wire MIOB. In a case where the one local wire LIOT has high data, that is, the potential VARY, the local inversion drive circuit 120 drives the main wire MIOB to the potential VSS. In contrast, in a case where the one local wire LIOT has low data, that is, the potential VSS, the main wire MIOB holds the external potential VDD. The data transferred to the main wire MIOB is transferred to the data read/write bus DRWSB by the main amplifier MA.

The following effects are obtained by the sub-amplifier SAP, the switching device 10, and the semiconductor device 1 according to the first embodiment.

(1) The sub-amplifier SAP includes: the first pre-charge circuit 110 that is connected to each of a pair of local wires LIOT and LIOB and releases the pre-charging of the pair of local wires LIOT and LIOB when write data is written and read data is read; the local inversion drive circuit 120 that is connected to one of the pair of local wires LIOT and LIOB and the main wire MIOB and inverts and transfers the write data from the main wire MIOB to the sense amplifier SA through the local wires LIOT and LIOB on the basis of a write signal; the local non-inversion drive circuit 130 that is connected to the other of the pair of local wires LIOT and LIOB and the main wire MIOB and transfers the write data from the main wire MIOB to the sense amplifier SA through the other of the local wires LIOT and LIOB on the basis of the write signal; and the main inversion drive circuit 140 that is connected to one of the pair of local wires LIOT and LIOB and the main wire MIOB and inverts and transfers the read data from one of the local wires LIOT and LIOB to the main wire MIOB on the basis of a read signal. Therefore, it is possible to perform single-ended transfer using the main wire MIOB and to increase the amount of data read and written at a time without reducing the pitch between the main wires MIOB or by increasing a chip surface area.

(2) The switching device 10 includes the sub-amplifier SAP and a plurality of pairs of sense amplifiers SA and column switches YSW. The column switch YSW is connected to the sub-amplifier SAP and a pair of the sense amplifier SA and the column switch YSW are provided so as to face each other with the sub-amplifier SAP interposed therebetween. Therefore, it is possible to connect a plurality of column switches YSW and sense amplifiers SA to the sub-amplifier SAP and to reduce the distance between the sub-amplifier SAP and the column switch YSW. That is, since the length of a pair of local wires LIOT and LIOB can be reduced, it is possible to reduce power consumption.

(3) The switching device 10 includes the sub-amplifier SAP and the main amplifier MA that is connected to the sub-amplifier SAP through the main wire MIOB. The main amplifier MA includes the second pre-charge circuit 23 that pre-charges the main wire MIOB. In addition, the second pre-charge circuit 23 performs pre-charging with an external potential higher than the potential used for pre-charging by the first pre-charge circuit 110. Therefore, in a case where the switching device 10 is not selected, a pair of local wires LIOT and LIOB are pre-charged to the potential VBLP and the main wire MIOB is pre-charged to the external potential VDD. Further, the source potential of the main inversion drive circuit 140 and the local inversion drive circuit 120 is pre-charged to VBLP. Therefore, it is possible to suppress a leakage current output to the main wire MIOB through the main inversion drive circuit 140, the local inversion drive circuit 120, and the local non-inversion drive circuit 130.

(4) The semiconductor device 1 includes the switching devices 10 that are arranged adjacent to each other, a plurality of main wires MIOB that are arranged in a direction intersecting the arrangement direction of the switching devices 10, and a plurality of column wires YS that are arranged along the arrangement direction of the switching device 10. Therefore, it is possible to increase the region in which the main wires MIOB can be arranged, as compared to a case where the main wires MIOB are arranged in the same direction as the column wires YS. For example, the width of a data bus can be increased eight times (a total of 1024) by setting the entire region in which the column wires YS are arranged as the region in which the main wires MIOB are provided.

Second Embodiment

Figure 7:
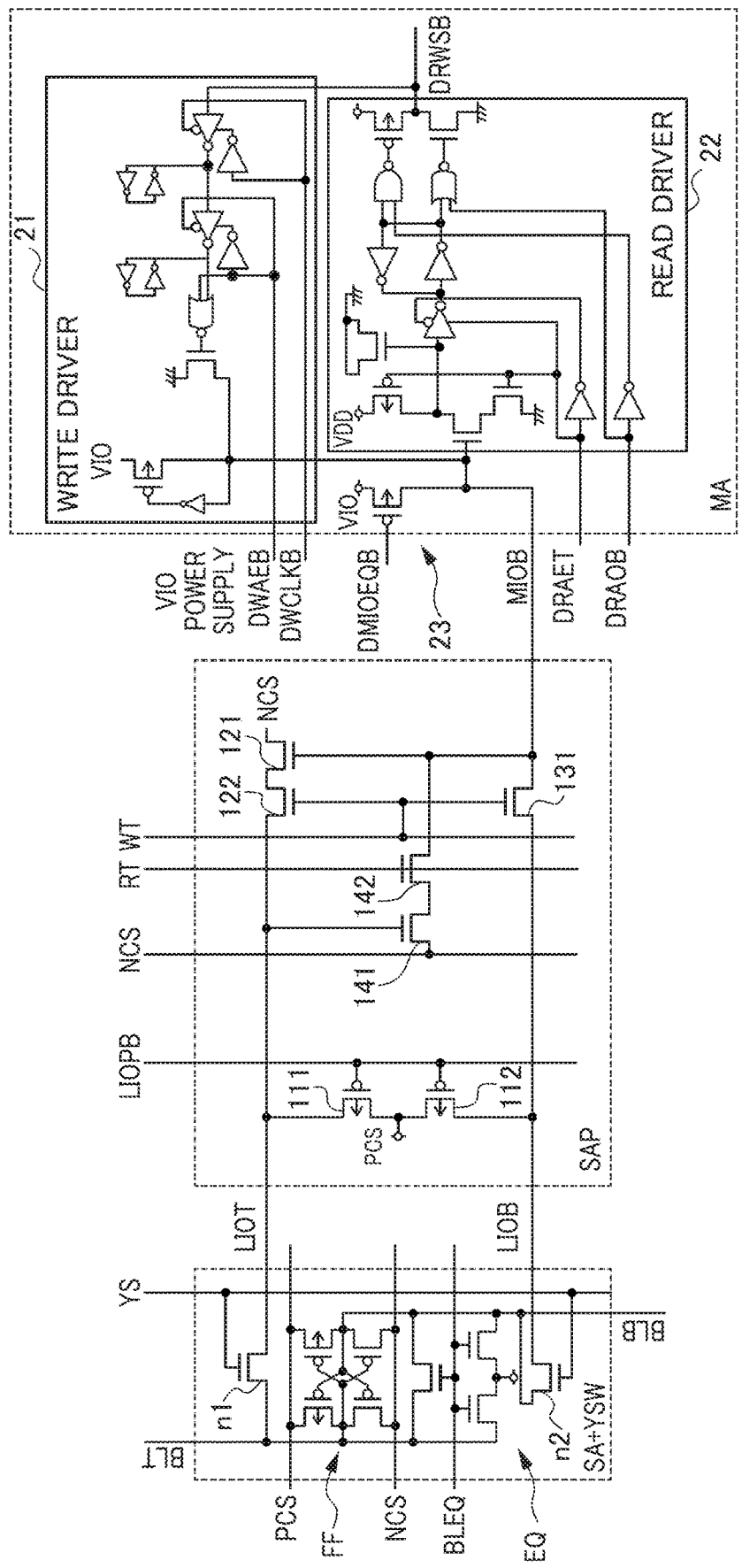
FIG. 7 is a circuit diagram illustrating a switching device according to a second embodiment of the invention.
Figure 8:
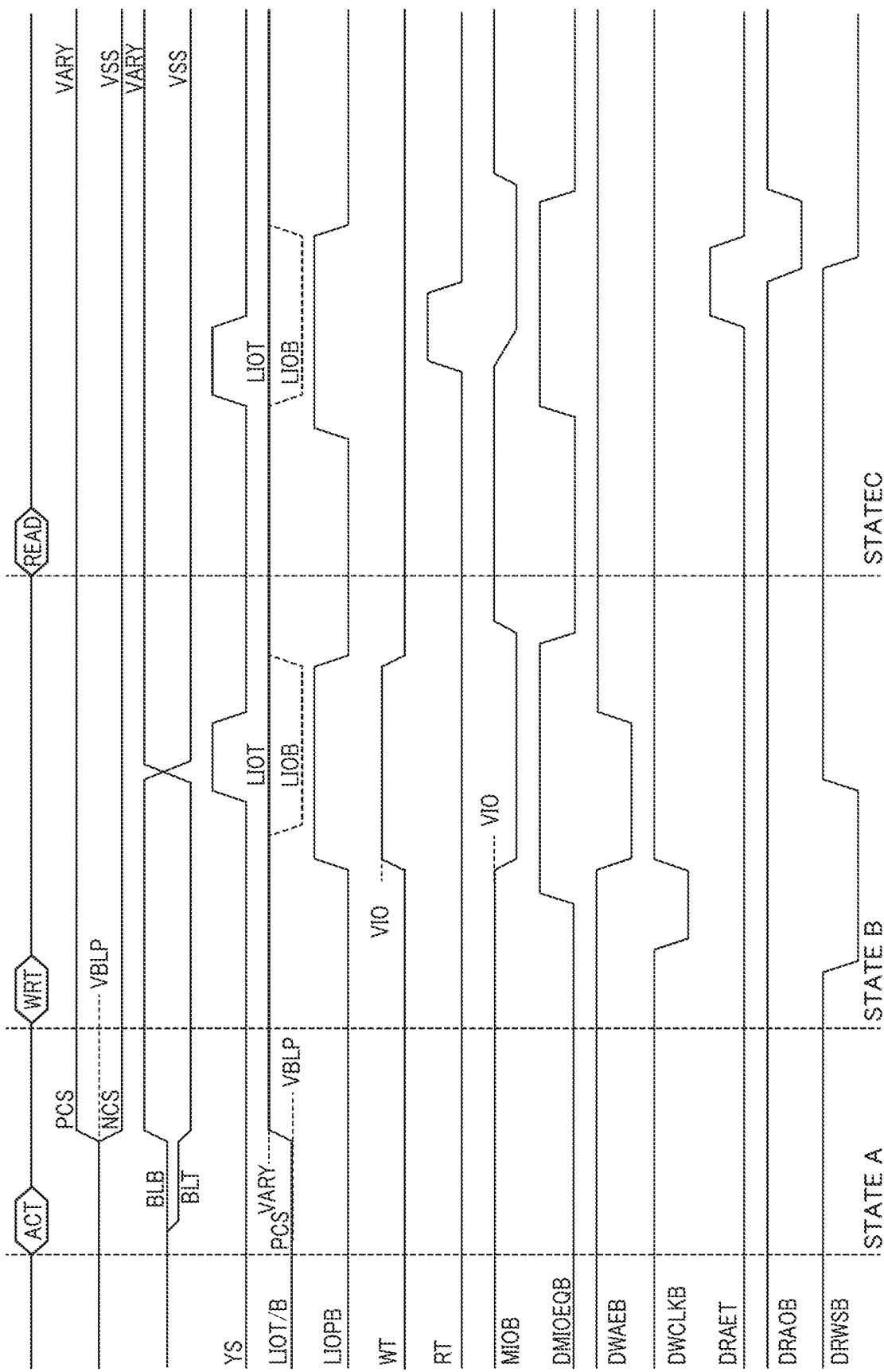
FIG. 8 is a waveform diagram illustrating an operation waveform of the switching device illustrated in FIG. 7.

Next, a sub-amplifier SAP, a switching device 10, and a semiconductor device 1 according to a second embodiment of the invention will be described. In the description of the second embodiment, the same components are denoted by the same reference numerals and the description thereof will be omitted or simplified. As illustrated in FIGS. 7 and 8, the sub-amplifier SAP, the switching device 10, and the semiconductor device 1 according to the second embodiment differ from those according to the first embodiment in that the second pre-charge circuit 23 of the main amplifier MA pre-charges the main wire MIOB with a potential VIO (for example, 0.8 V) lower than the external potential VDD. Therefore, data transferred to the main wire MIOB oscillates between the potentials VIO and VSS. The second embodiment differs from the first embodiment in that the circuit of the main amplifier MA is configured such that the main wire MIOB is connected to a gate of the nMOS transistor (having a drain to which the external potential VDD is applied) in order to respond to a reduction in the amplitude of data transferred to the main wire MIOB. In addition, the second embodiment differs from the first embodiment in that the write signal NT has an amplitude of VIO-VSS in a case where the potential VARY of the other of the local wires LIOT and LIOB is higher than the potential VIO of the main wire MIOB.

The following effect is obtained by the sub-amplifier SAP, the switching device 10, and the semiconductor device 1 according to the second embodiment.

(5) The second pre-charge circuit 23 pre-charges the main wire MIOB with a potential lower than the external potential VDD. Therefore, it is possible to reduce the amount of operating current.

Third Embodiment

Figure 9:
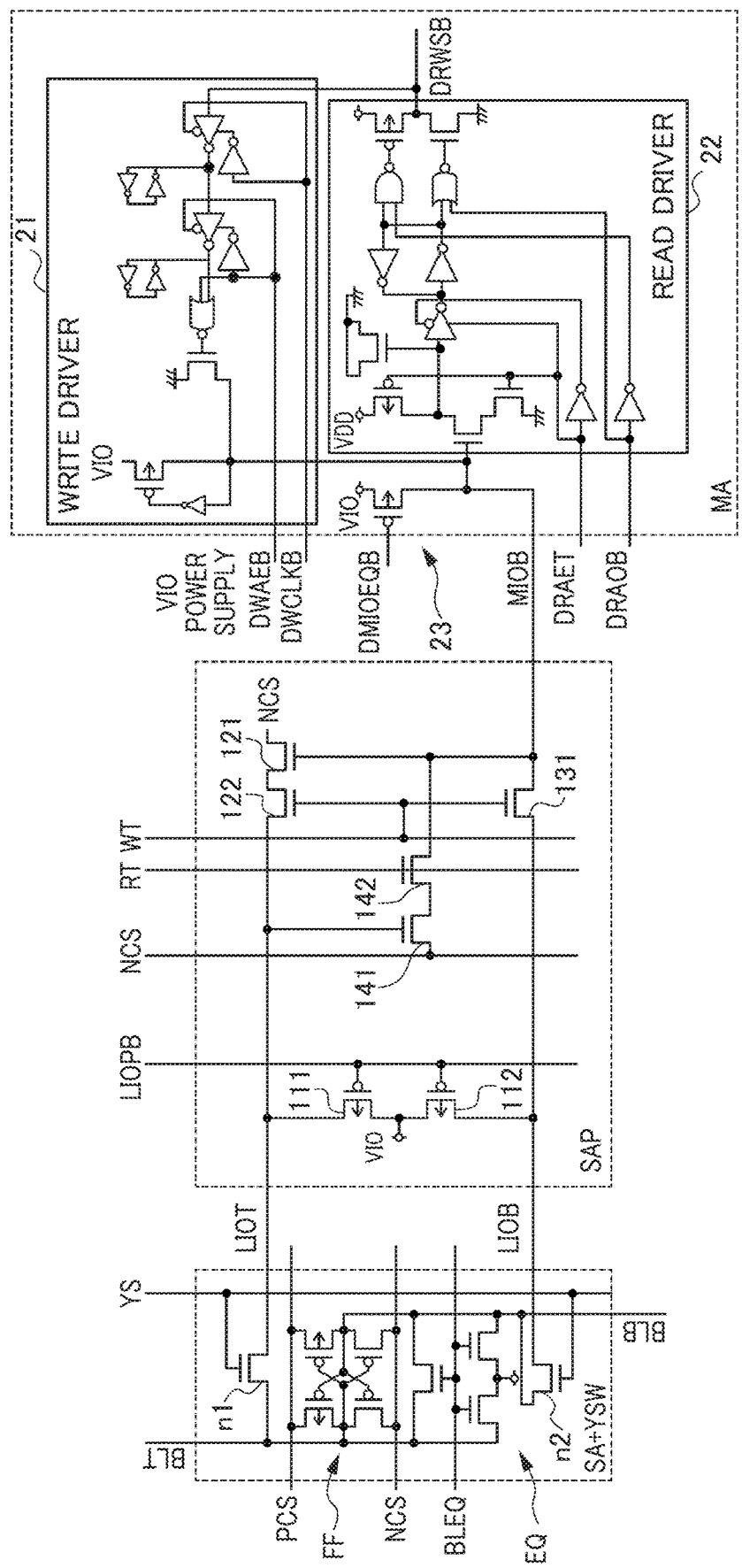
FIG. 9 is a circuit diagram illustrating a switching device according to a third embodiment of the invention.
Figure 10:
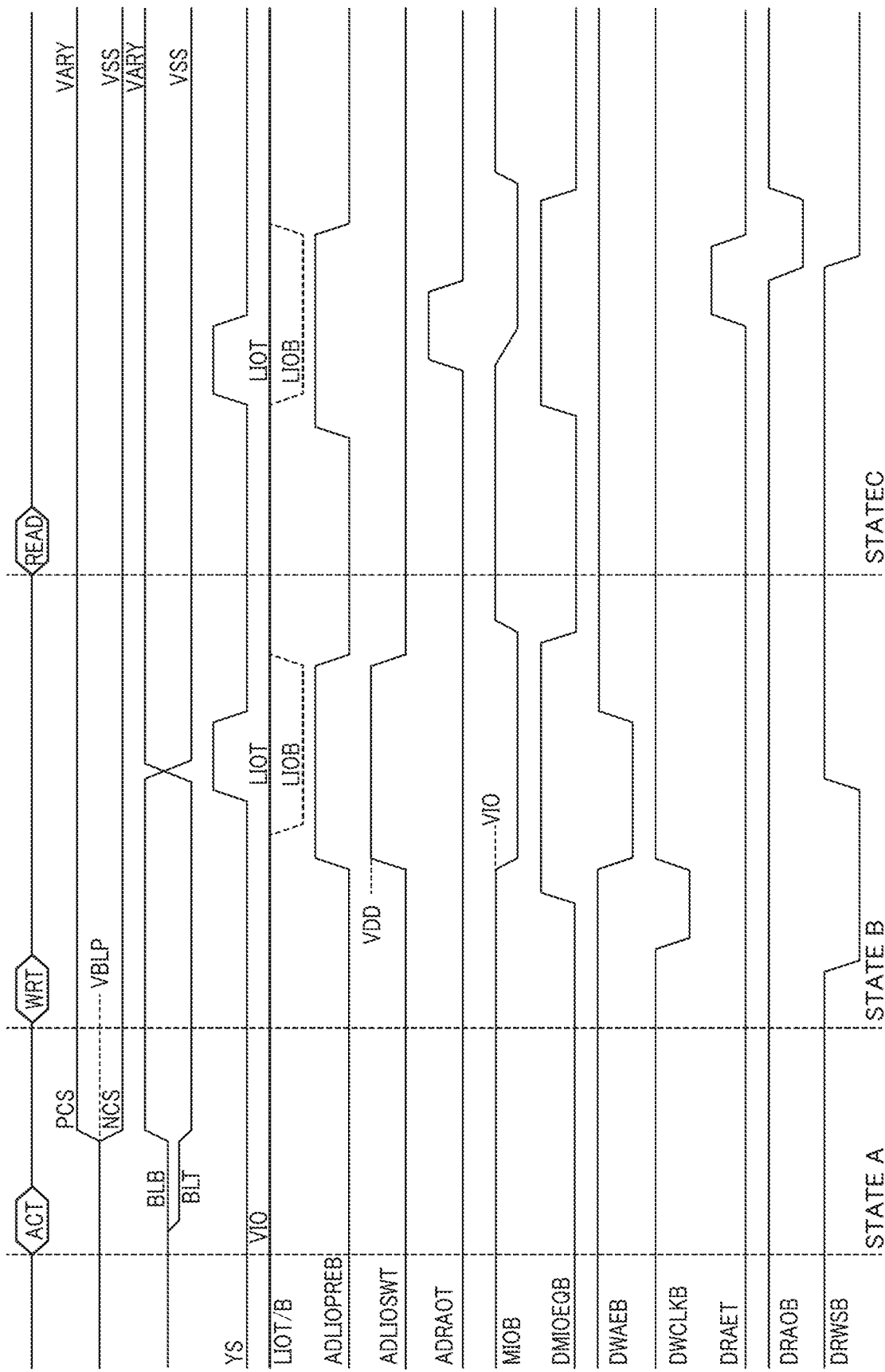
FIG. 10 is a waveform diagram illustrating an operation waveform of the switching device illustrated in FIG. 9.

Next, a sub-amplifier SAP, a switching device 10, and a semiconductor device 1 according to a third embodiment of the invention will be described with reference to FIGS. 9 and 10. In the description of the third embodiment, the same components are denoted by the same reference numerals and the description thereof will be omitted or simplified. As illustrated in FIGS. 9 and 10, the sub-amplifier SAP, the switching device 10, and the semiconductor device 1 according to the third embodiment differ from those according to the second embodiment in that, in addition to the second embodiment, the first pre-charge circuit 110 pre-charges a pair of local wires LIOT and LIOB with the same potential VIO as a potential at which the second pre-charge circuit 23 pre-charges the main wire MIOB. Specifically, the first pre-charge circuit 110 is connected to the power supply VIO having the same potential as a potential of the second pre-charge circuit 23. Therefore, the first pre-charge circuit 110 pre-charges a pair of local wires LIOT and LIOB with the potential VIO.

In addition to (5), the following effect is obtained by the sub-amplifier SAP, the switching device 10, and the semiconductor device 1 according to the third embodiment.

(6) The first pre-charge circuit 110 pre-charges a pair of local wires LIOT and LIOB with the same potential VIO as a potential at which the second pre-charge circuit 23 pre-charges the main wire MIOB. Therefore, the potential VIO of the pair of local wires LIOT and LIOB becomes the potential VIO of the main wire MIOB. As a result, it is possible to suppress the generation of a leakage current between the pair of local wires LIOT and LIOB and the main wire MIOB. In addition, since the amplitude of data transferred through the pair of local wires LIOT and LIOB is between the potential VSS and the potential VIO, it is possible to suppress the power consumption of the pair of local wires LIOT and LIOB.

Fourth Embodiment

Figure 11:
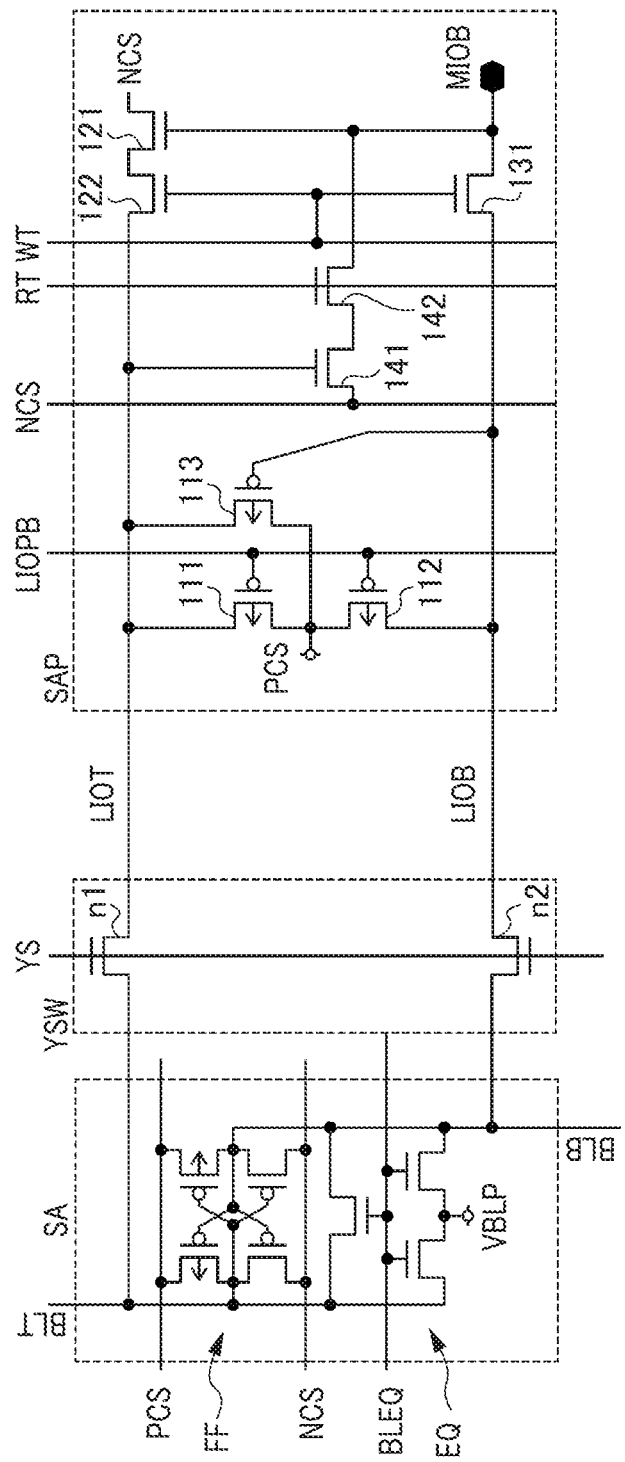
FIG. 11 is a circuit diagram illustrating a sub-amplifier according to a fourth embodiment of the invention.

Next, a sub-amplifier SAP, a switching device 10, and a semiconductor device 1 according to a fourth embodiment of the invention will be described with reference to FIG. 11. In the description of the fourth embodiment, the same components are denoted by the same reference numerals and the description thereof will be omitted or simplified. The sub-amplifier SAP, the switching device 10, and the semiconductor device 1 according to the fourth embodiment differ from those according to the first to third embodiments in that the first pre-charge circuit 110 maintains the potential of one local wire LIOT at a pre-charge potential in a case where high data is read from the sense amplifier SA and the potential of one local wire LIOT is less than a predetermined value. Specifically, the fourth embodiment differs from the first to third embodiments in that the first pre-charge circuit 110 further includes a pMOS transistor 113 having a drain connected to the power line PCS, a source connected to one local wire LIOT, and a gate connected to the other local wire LIOB as illustrated in FIG. 11.

In addition to the effects of (1) to (6), the following effect is obtained by the sub-amplifier SAP, the switching device 10, and the semiconductor device 1 according to the fourth embodiment.

(7) In a case where high data is read from the sense amplifier SA and the potential of one of the local wires LIOT and LIOB is less than a predetermined value, the first pre-charge circuit 110 maintains the potential of one of the local wires LIOT and LIOB at a pre-charge potential. In a case where high data is read, the other local wire LIOB is drawn to a low potential. Therefore, even when noise causing the potential of one local wire LIOT to be reduced is generated, it is possible to maintain the potential of one local wire LIOT at the potential PCS and thus to stabilize the reading operation. In addition, in a case where high data is inverted and written to the sense amplifier SA that holds low data, it is possible to prevent the potential of one local wire LIOT from being excessively reduced when the column switch YSW is selected to be high (on) and thus to stabilize the operation.

Fifth Embodiment

Figure 12:
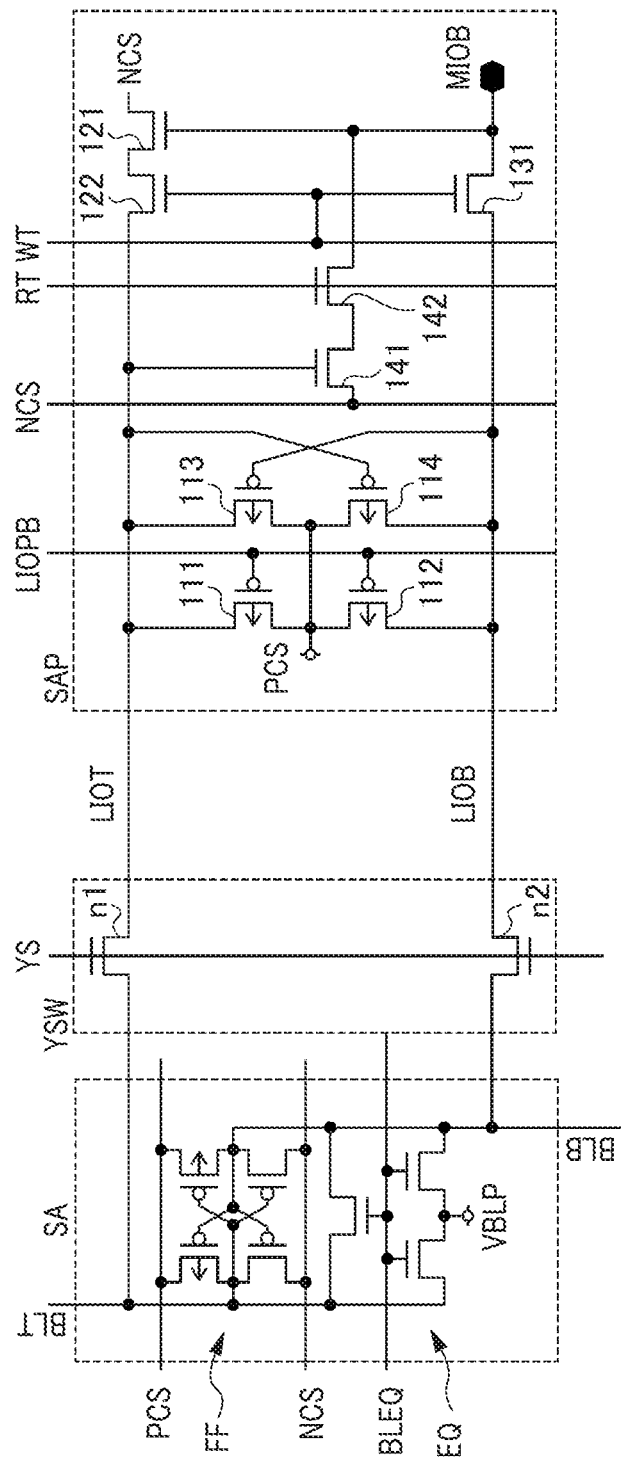
FIG. 12 is a circuit diagram illustrating a sub-amplifier according to a fifth embodiment of the invention.

Next, a sub-amplifier SAP, a switching device 10, and a semiconductor device 1 according to a fifth embodiment of the invention will be described with reference to FIG. 12. The sub-amplifier SAP, the switching device 10, and the semiconductor device 1 according to the fifth embodiment differ from those according to the first to fourth embodiments in that the potential of the other local wire LIOB is maintained at a pre-charge potential in a case where low data is inverted and written to the sense amplifier SA that holds high data by the first pre-charge circuit 110 and the potential of the other local wire LIOT is less than a predetermined value. Specifically, as illustrated in FIG. 12, the first pre-charge circuit 110 differs from the first pre-charge circuit 110 according to the fourth embodiment in that it further includes one pMOS transistor. That is, the first pre-charge circuit 110 further includes a pMOS transistor 114 having a drain connected to the power line PCS, a source connected to the other local wire LIOB, and a gate connected to one local wire LIOT.

In addition to the effect of (7), the following effect is obtained by the sub-amplifier SAP, the switching device 10, and the semiconductor device 1 according to the fifth embodiment.

(8) The first pre-charge circuit 110 maintains the potential of the other local wire LIOB at a pre-charge potential in a case where low data is inverted and written to the sense amplifier SA that holds high data and the potential of the other local wire LIOB is less than a predetermined value. When low data is read, one local wire LIOT is drawn to a low potential. Therefore, even when noise causing the potential of the other local wire LIOB to be reduced is generated, it is possible to maintain the potential of the other local wire LIOB at the potential PCS and thus to stabilize the reading operation. In addition, in a case where low data is inverted and written to the sense amplifier SA that holds high data, the column switch YSW is selected to be high (on). Therefore, it is possible to prevent the potential of the other local wire LIOB from being excessively reduced and thus to stabilize the operation.

The preferred embodiments of the sub-amplifier, the switching device, and the semiconductor device according to the invention have been described above. However, the invention is not limited to the above-described embodiments and can be appropriately modified.

For example, in the above-described embodiments, four column switches YSW and four sense amplifiers SA are connected to one sub-amplifier SAP. However, the invention is not limited to thereto. For example, five or more column switches YSW and five or more sense amplifiers SA may be connected to one sub-amplifier SAP.

EXPLANATION OF REFERENCE NUMERALS

1 SEMICONDUCTOR DEVICE
10 SWITCHING DEVICE
23 SECOND PRE-CHARGE CIRCUIT
110 FIRST PRE-CHARGE CIRCUIT
120 LOCAL INVERSION DRIVE CIRCUIT
130 LOCAL NON-INVERSION DRIVE CIRCUIT
140 MAIN INVERSION DRIVE CIRCUIT
LIOT ONE LOCAL WIRE
LIOB THE OTHER LOCAL WIRE
MIOB MAIN WIRE
SA SENSE AMPLIFIER
SAP SUB-AMPLIFIER
RT READ SIGNAL, READ WIRE
WT WRITE SIGNAL, WRITE WIRE
YSW COLUMN SWITCH
VDD EXTERNAL POTENTIAL
DRWSB DATA READ/WRITE BUS

The invention claimed is:
1. A semiconductor device, comprising:
a plurality of the switching devices that are arranged adjacent to each other;
a plurality of main wires that are arranged in a direction intersecting an arrangement direction of the switching devices; and
a plurality of column wires that are arranged in the arrangement direction of the switching devices,
wherein the switching device comprises:
a sub-amplifier connected to a sense amplifier through a column switch and connected to a main wire through which write data and read data are transferred;
a plurality of pairs of sense amplifiers and column switches, wherein the column switches are connected to the sub-amplifier, and wherein a pair of the sense amplifier and the column switch are arranged so as to face each other with the sub-amplifier interposed between the sense amplifier and the column switch,
wherein the sub-amplifier comprising:
a pair of local wires that are connected to the sense amplifier and the column switch;
a first pre-charge circuit that is connected to each of the pair of local wires and releases pre-charging of the pair of local wires when the write data is written and the read data is read;
a local inversion drive circuit that is connected to one of the pair of local wires and the main wire and inverts and transfers the write data from the main wire to the sense amplifier through the one local wire on the basis of a write signal;

a local non-inversion drive circuit that is connected to the other of the pair of local wires and the main wire and transfers the write data from the main wire to the sense amplifier through the other local wire on the basis of the write signal; and a main inversion drive circuit that is connected to one of the pair of local wires and the main wire and inverts and transfers the read data from the one local wire to the main wire on the basis of a read signal.

2. The semiconductor device according to claim 1, wherein the first pre-charge circuit maintains a potential of the one local wire at a pre-charge potential in a case where high data is read from the sense amplifier and the potential of the one local wire is less than a predetermined value.

3. The semiconductor device according to claim 1, wherein the first pre-charge circuit maintains a potential of the other local wire at the pre-charge potential in a case where low data is inverted and written to the sense amplifier that holds high data and the potential of the other local wire is less than a predetermined value.

4. The semiconductor device according to claim 1, comprising:

a main amplifier that is connected to the sub-amplifier through a main wire, wherein the main amplifier includes a second pre-charge circuit that pre-charges the main wire.

5. The semiconductor device according to claim 4, wherein the second pre-charge circuit pre-charges the main wire with an external potential higher than a potential used for the pre-charging by the first pre-charge circuit.

6. The semiconductor device according to claim 4, wherein the second pre-charge circuit pre-charges the main wire with a potential lower than an external potential.

7. The semiconductor device according to claim 6, wherein the first pre-charge circuit pre-charges the pair of local wires with the same potential as a potential at which the second pre-charge circuit pre-charges the main wire.

* * * * *